United States Patent
Chung et al.

(10) Patent No.: US 7,502,885 B2
(45) Date of Patent: Mar. 10, 2009

(54) METHOD OF OPERATING FLASH MEMORY CHIPS

(75) Inventors: Jun Seop Chung, Seoul (KR); Joong Seob Yang, Kyeongki-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 362 days.

(21) Appl. No.: 11/324,009

(22) Filed: Dec. 29, 2005

(65) Prior Publication Data

US 2007/0058431 A1    Mar. 15, 2007

(30) Foreign Application Priority Data

Sep. 15, 2005    (KR) ................. 10-2005-0086183

(51) Int. Cl.
*G06F 12/00* (2006.01)
(52) U.S. Cl. .................. 711/103; 711/102
(58) Field of Classification Search .......... None
See application file for complete search history.

(56) References Cited

U.S. PATENT DOCUMENTS 6,229,737 B1 * 5/2001 Walukas ............. 365/185.33
6,880,038 B2   4/2005 Jacobs
2005/0041478 A1 * 2/2005 Matsushita et al. .... 365/185.29

FOREIGN PATENT DOCUMENTS

| KR | 10-2001-0035775 A | 5/2001 |
| KR | 10-2002-0094356 A | 12/2002 |
| KR | 10-2005-0108986 A | 11/2005 |

* cited by examiner

*Primary Examiner*—Reginald G Bragdon
*Assistant Examiner*—Thanh D Vo
(74) *Attorney, Agent, or Firm*—Townsend and Townsend and Crew LLP (57) ABSTRACT

A method of operating a packaged flash memory module includes applying a first program or erase command and a first address associated with the first commend to a first flash memory chip of a plurality of flash memory chips that are arranged within the packaged flash memory module; applying a second program or erase command and a second address associated with the second commend to a second flash memory chip of the plurality of flash memory chips that are arranged within the packaged flash memory module, the second command being applied to the second flash memory chip prior to the completion of the first command by the first flash memory chip; and determining whether or not the first flash memory chip has completed the first command.

5 Claims, 8 Drawing Sheets

| Function | Write performance [MB/s] |
|---|---|
| Related art (normal page program) | 10.4 |
| Related art (cache program) | 14.0 |
| Present embodiment (normal page program) | 16.5 |
| Present embodiment (cache program) | 27.9 |

METHOD OF OPERATING FLASH MEMORY CHIPS

BACKGROUND

The present invention relates to a method of operating NAND flash memory chips, and more particularly, to a method operating a plurality of NAND flash memory chips stacked in a package.

A flash memory is a kind of a non-volatile memory in which data can be stored even when power is off. The flash memory can be electrically programmed and erased and does not need a refresh function by rewriting data at periodical cycles. The term "program" refers to an operation of writing data into memory cells and the term "erase" refers to an operation of erasing data from memory cells.

The flash memory device are generally classified into either NOR flash or NAND flash depending on the structure of the cells and operation conditions. The NOR flash memory has the source of each memory connected to a ground terminal (VSS) and can program and erase with respect to any particular address. The NOR flash memory is mainly used for application fields requiring high-speed operation.

To the contrary, the NAND flash memory has a plurality of memory cells connected in series to form a string. Memory cells connected to a single word line forms one page. The NAND flash memory is mainly used for application fields high data capacity.

The flash memory chips employs a memory controller located between the flash memory and a host system for exchanging data with the host system. The memory controller manages exchange data between flash memory chips stacked in a package and the host system.

Figure 1:
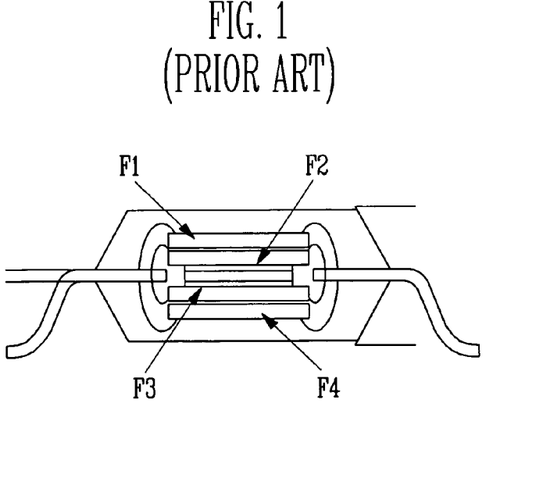
FIG. 1 is a view showing NAND flash memory chips.
Figure 2A:
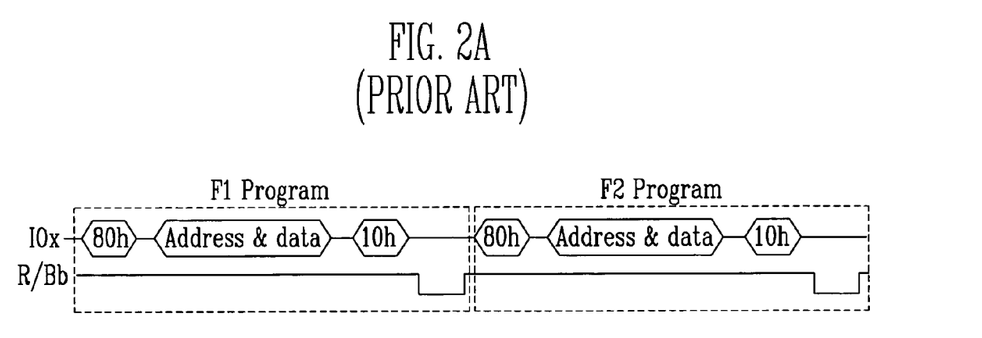
FIGS. 2a and 2b are flowcharts illustrating the program method of the NAND flash memory chips shown in FIG. 2.
Figure 2B:
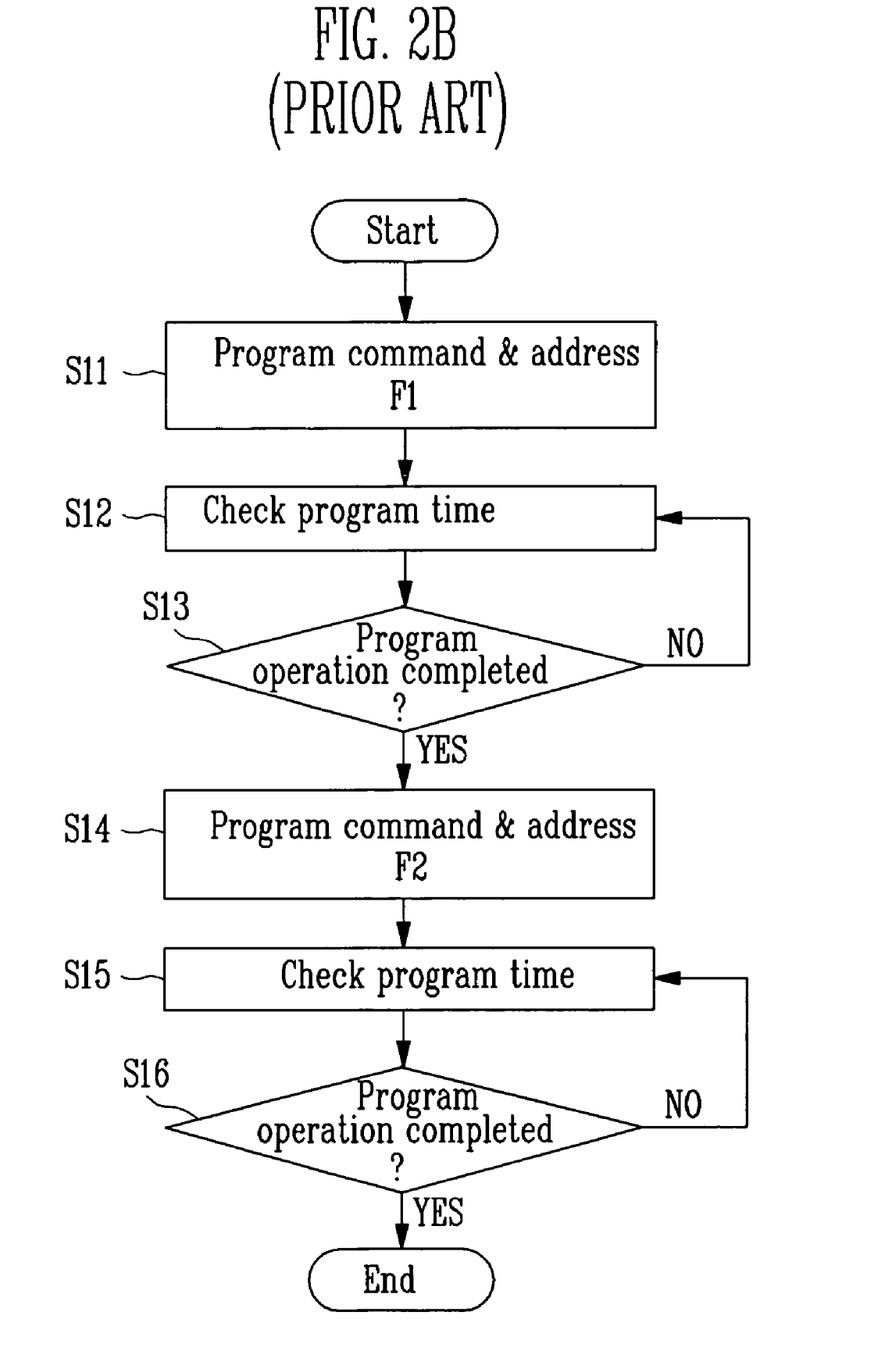

FIG. 1 shows NAND flash memory chips F1 through F4 stacked in a package. FIG. 2a is a timing diagram for programming data into the NAND flash memory chips F1 and F2. In FIG. 2a, "IOx" indicates an input signal and "R/Bb" indicates a program start signal. FIG. 2b is a flowchart illustrating a conventional method of programming data into the NAND flash memory chips F1 and F2.

In the related art, a memory controller (not shown) selects and drives one NAND flash memory chip at a time when driving the NAND flash memory chips F1 through F4 shown in FIG. 1. Therefore, when driving two or more NAND flash memory chips (e.g., F1 and F2), a subsequent NAND flash memory chip is driven after the prior NAND flash memory chip has finished a program command, as shown in FIG. 2b.

Hereinafter, a conventional method of programming data into two NAND flash memory chips stacked in a package will be described with reference to FIG. 2b.

A program command & an address are applied to the first NAND flash memory chip F1 to drive the NAND flash memory chip F1 at step S11. The program time is then checked at step S12 to determine whether the program operation has been completed at step S13. As a result of the determination, if the program operation has not been completed, the process returns to step S12 wherein the program time is checked after waiting for the program operation to finish.

If it is determined that the program operation has been completed, a program command & an address is applied to a second NAND flash memory chip F2 to drive the second NAND flash memory chip F2 at step S14. The program time is then checked at step S15 to determine whether the program operation has been completed at step S16. As a result of the determination, the process returns to step S15 wherein the program time is checked after waiting for the program operation to finish.

If it is determined that the program operation has been completed, the whole program operation on the NAND flash memory chips F1 and F2 is completed.

That is, in the related art, when driving two or more NAND flash memory chips stacked within a package, the next NAND flash memory chip is driven after the operation of a NAND flash memory chip is finished.

In this conventional method, after a NAND flash memory chip performs the program operation, the next NAND flash memory chip performs the program operation. Therefore, a lot of program (erase or read) time is taken up.

SUMMARY OF THE INVENTION

An advantage of the present invention is that it reduces the overall operating time in such a manner that a NAND flash memory that is stacked with a plurality of chips in a package is operated without waiting for the completion of the previously initiated operation on one of the other NAND flash memory chips.

According to an aspect of the present invention, there is provided a method of operating flash memory chips, including the steps of (a) sequentially applying an operation command and an address to N flash memory chips stacked within a package, (b) checking an operating time of a first flash memory chip, as a result of the check, if the operating time has not been completed, sequentially checking the operating time from a second flash memory chip and so on to a $N^{th}$ flash memory chip, and then checking the operating time of the first flash memory chip again, (c) if the operating time of one of the first through $N^{th}$ flash memory chips has been completed, determining whether a page of the flash memory chip whose operation has been completed is a last page, and (d) if it is determined that the page of the flash memory chip whose operation has been completed is the last page, checking the operating time of the next flash memory chip, and if it is determined that the page of the flash memory chip whose operation has been completed is not the last page, increasing the address, applying an operating command and the increased address to the flash memory chip whose operation has been completed, and then checking an operating time of the next flash memory chip.

According to another aspect of the present invention, there is provided a method of operating flash memory chips, including the steps of (a) sequentially applying an operation command and an address to N flash memory chips stacked within a package, (b) checking an operating time of a first flash memory chip, as a result of the check, if the operating time of the first flash memory chip has not been completed, checking an operating time of a second flash memory chip, and as a result of the check, if the operating time of the first flash memory chip has been completed, determining whether a page of the first flash memory chip is a last page, (c) as a result of the determination, if the page of the first flash memory chip is the last page, checking an operating time of the second flash memory chip, and as a result of the determination, if the page of the first flash memory chip is not the last page, increasing the address, applying an operating command and the increased address to the first flash memory chip, and then checking an operating time of the second flash memory chip, (d) if the operating time has not been completed after checking the operating time of a $N^{th}$ flash memory chip by sequentially performing the steps (b) and (c), allowing the process to return to step (b), and if the operating time has been completed, determining whether a page of the $N^{th}$ flash memory chip is a last page, and (e) as a result of the determination, if the page of the $N^{th}$ flash memory chip is the last page, allowing the process to return to the step (b), and if the page of the $N^{th}$ flash memory chip is not the last page, increasing the address, applying an operating command and the increased address to the $N^{th}$ flash memory chip, and then allowing the process to return to the step (b).

In one embodiment, a method of operating a packaged flash memory device includes sequentially applying a first command to perform an operation and a first address associated with the operation to N flash memory chips that are vertically arranged within the packaged flash memory device. Thereafter, it is determined whether or not a first flash memory chip has completed the operation. If the operation is determined to have not been completed by the first memory chip, examining whether or not a second flash memory chip has completed the operation. If the operation is determined to have been completed by the first flash memory chip, examining whether or not the operation completed corresponds to a last page of the first flash memory chip.

The method further comprises if the operation completed corresponds to the last page of the first flash memory chip, examining whether or not the second flash memory chip has completed the operation; and if the operation completed does not correspond to the last page of the first flash memory chip, applying a second command to perform a second operation and a second address associated with the second operation to the first flash memory chip.

In another embodiment, a method of operating a packaged flash memory module includes applying a first program or erase command and a first address associated with the first commend to a first flash memory chip of a plurality of flash memory chips that are arranged within the packaged flash memory module; applying a second program or erase command and a second address associated with the second commend to a second flash memory chip of the plurality of flash memory chips that are arranged within the packaged flash memory module, the second command being applied to the second flash memory chip prior to the completion of the first command by the first flash memory chip; and determining whether or not the first flash memory chip has completed the first command. If the first command is determined to have not been completed by the first memory chip, examining whether or not a second flash memory chip has completed the second command. If the first command is determined to have been completed by the first flash memory chip, examining whether or not the completed first command corresponds to a last page of the first flash memory chip.

The plurality of flash memory chips are NAND chips. The method further comprises if the first command completed corresponds to the last page of the first flash memory chip, examining whether or not the second flash memory chip has completed the second command; and if the operation completed does not correspond to the last page of the first flash memory chip, applying a third program or erase command to and a second address to the first flash memory chip, wherein the plurality of flash memory chips are at least four chips. The plurality of flash memory chips are vertically stacked on each other, wherein a third flash memory device is provided between the first and second flash memory chips.

DETAILED DESCRIPTION OF SPECIFIC EMBODIMENTS

The present invention will now be described in connection with specific embodiments with reference to the accompanying drawings.

Figure 3:
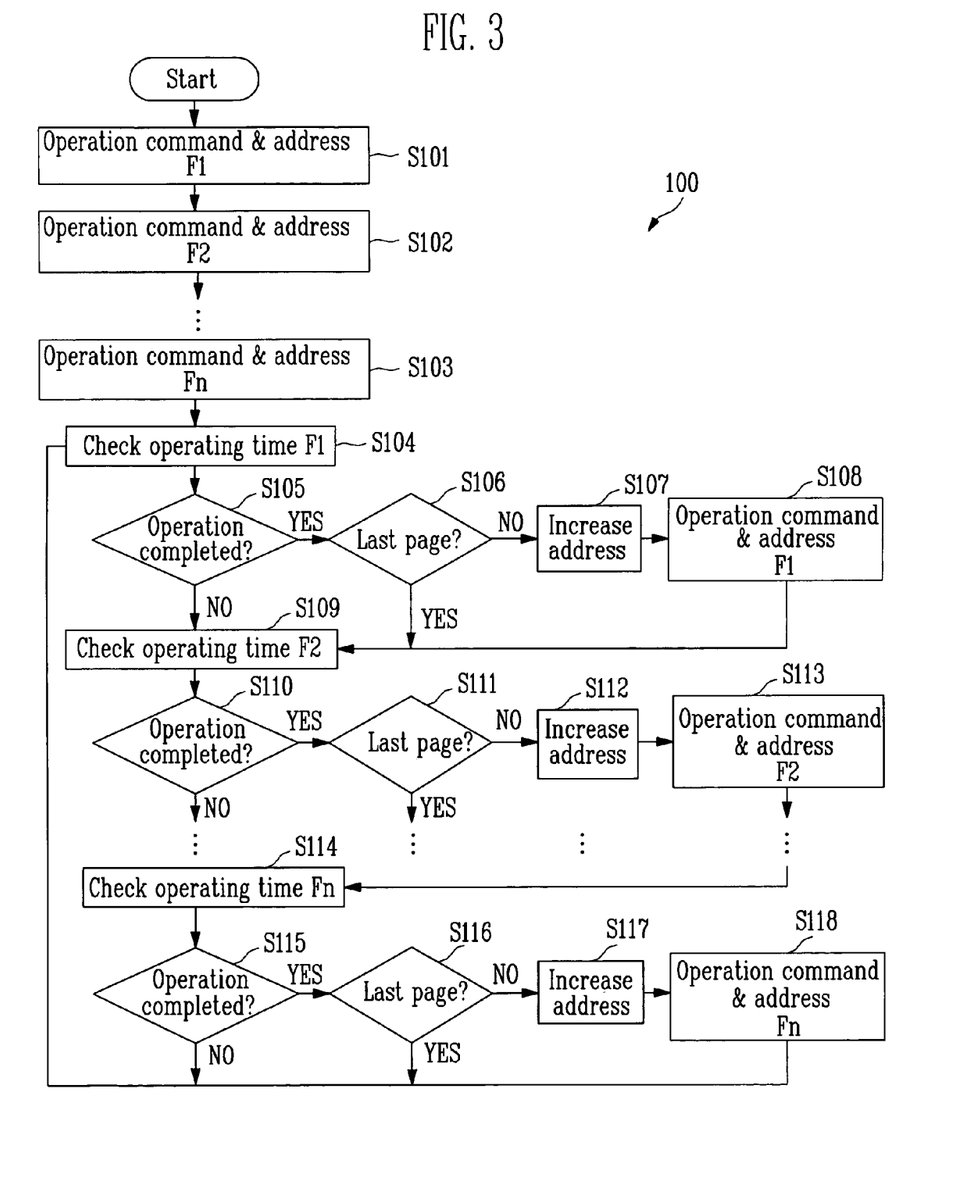
FIG. 3 is a flowchart illustrating a method of operating NAND flash memory chips, stacked in a package, at the same time according to one embodiment of the present invention.

FIG. 3 is a flowchart illustrating a method or process 100 of operating NAND flash memory chips according to a one embodiment of the present invention, and more particularly, shows an algorithm that is performed in a memory controller (not shown) in order to improve the overall operating speed of N NAND flash memory chips stacked in a package.

Referring to FIG. 3, an operating command and an address are sequentially applied to each of NAND flash memory chips F1 through Fn at step S101 through S103. That is, first, second, third, and fourth commands and addresses are applied to first, second, third, and fourth chips, respectively, according to the order the chips will be driven (e.g., programmed or erased). The operating command and address are applied to a NAND flash memory chip without waiting for the completion of the operation by the chip with an earlier sequence. For example, the second command and second address are applied to the second chip without waiting for the first chip to finish the first command on the first address.

Through the above process, if the operation of applying the operating command & an address is finished, the operating time is checked from the first NAND flash memory chip F1 that has received the operating command for the first time (step S104). If the operating time has not finished (e.g., the operation has been completed by the first chip), the operating time of the second NAND flash memory chip F2 is checked (step S109). If the operating time has been finished, on other hand, it is determined whether or not the page in which the operation of the first NAND flash memory chip F1 has finished relates to the last page (step S106).

If the page in which the completed operation of the first NAND flash memory chip F1 is determined to be the last page, the operating time of the second NAND flash memory chip F2 is checked (step S109). If it is determined that the page is not the last page of the first chip, the address is increased and an operating command and the increased address are again applied to the first NAND flash memory chip F1 (step S108). The process then proceeds to step S109 where the operating time of the second NAND flash memory chip F2 is checked. When the address is increased, the address can be increased by +1 sequentially. Alternatively, the address may be selected using other methods, e.g., randomly selecting an address from those that are waiting to be selected.

The above-described operation is repeated to check the operating time of the last chip (or $N^{th}$ NAND flash memory chip Fn) (step S114). If the operating time of the last $N^{th}$ NAND flash memory chip Fn has not been completed, the process returns to step S104 again where the operating time of the first NAND flash memory chip F1 is checked. In this embodiment, the last chip is the fourth chip, but may be a fifth chip or sixth chip and so on in other embodiments according to the number of chips that are provided in the package.

If it is determined that the operating time of the $N^{th}$ NAND flash memory chip Fn has been completed, it is determined whether or not the completed operation relates to a last page of the $N^{th}$ NAND flash memory chip Fn (step S116). If the completed operation relates to the last page of the $N^{th}$ NAND flash memory chip Fn, the process returns to step S104 to check the operating time of the first NAND flash memory chip F1.

On the other hand, if the completed operation does not relate to the last page of the $N^{th}$ NAND flash memory chip Fn, an operating command and a new address are applied to the $N^{th}$ NAND flash memory chip Fn (step S118). The new address is obtained by incrementing the previous address by a given integer, e.g., by 1, in the present embodiment. The process then proceeds to step S104 to check the operating time of the first NAND flash memory chip F1.

The above procedures are repeated until all the operations for the NAND flash memory chips F1 through Fn are completed. Although not shown in the drawing, if the operation completed is determined to correspond to the last page of the respective chips (steps S106, S111 and S116), the process 100 for the NAND flash memory chips F1 through Fn stops. A time where the operation of the NAND flash memory chips F1 through Fn is finished may be different depending on the number of pages.

Figure 4A:
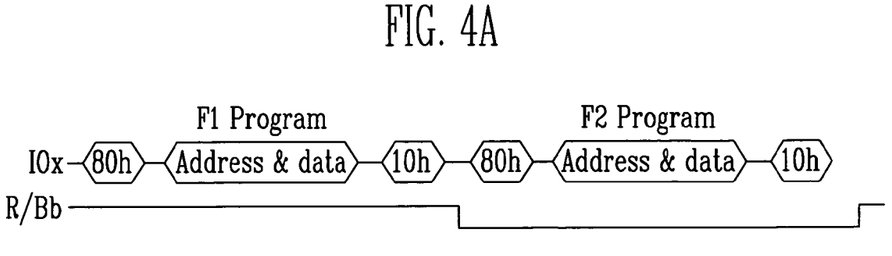
FIGS. 4a and 4b are flowcharts illustrating a method of programming stacked NAND flash memory chips at the same time in the operating method of FIG. 3.
Figure 4B:
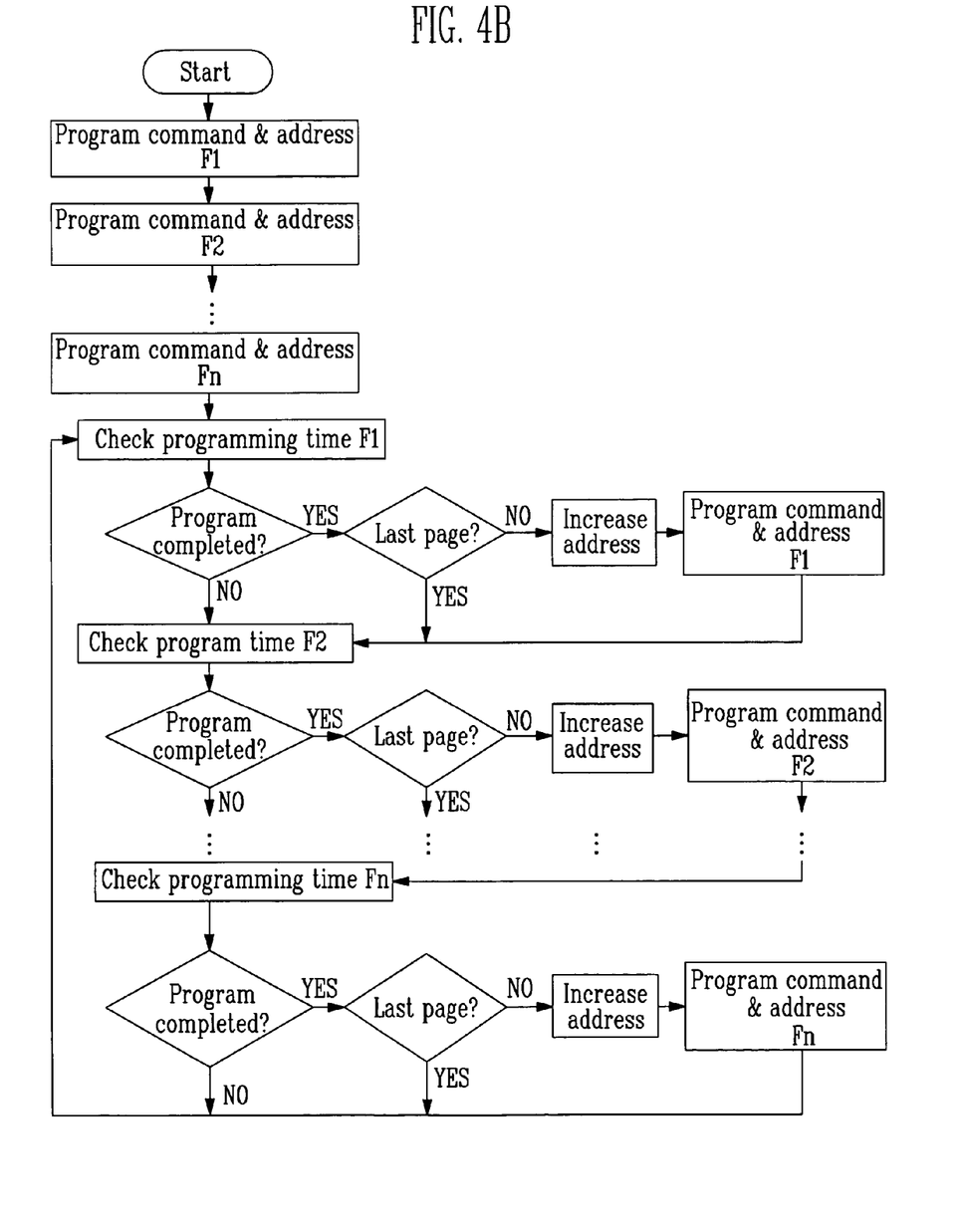
Figure 5A:
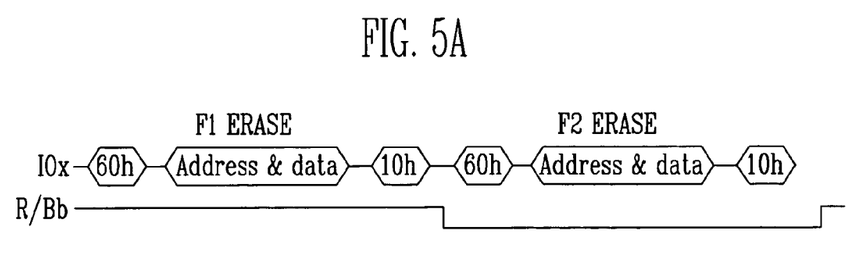
FIGS. 5a and 5b are a flowchart illustrating a method of erasing stacked NAND flash memory chips at the same time in the operating method of FIG. 3.
Figure 5B:
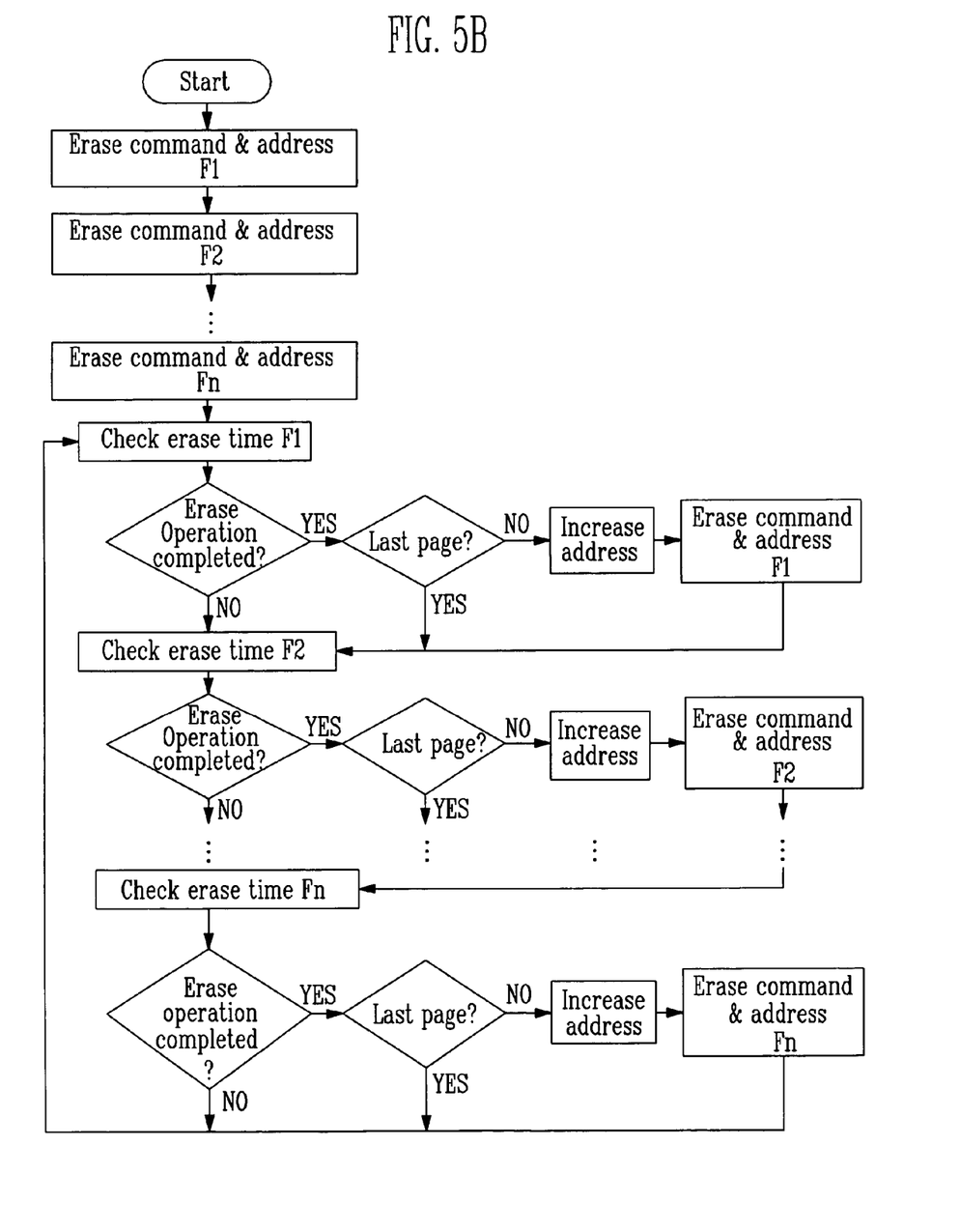

FIGS. 4a and 4b shows a program operation when the operating command shown in FIG. 3 is a program command. FIGS. 5a and 5b shows an erase operation when the operating command shown in FIG. 3 is an erase command.

In FIGS. 4a and 5b, "IOx" indicates an input signal and "R/Bb" indicates a program or erase start signal.

The flowchart of the program operation and the erase operation shown in FIGS. 4b and 5b correspond to that shown in FIG. 3. Description thereof are omitted for simplicity.

Figure 6:
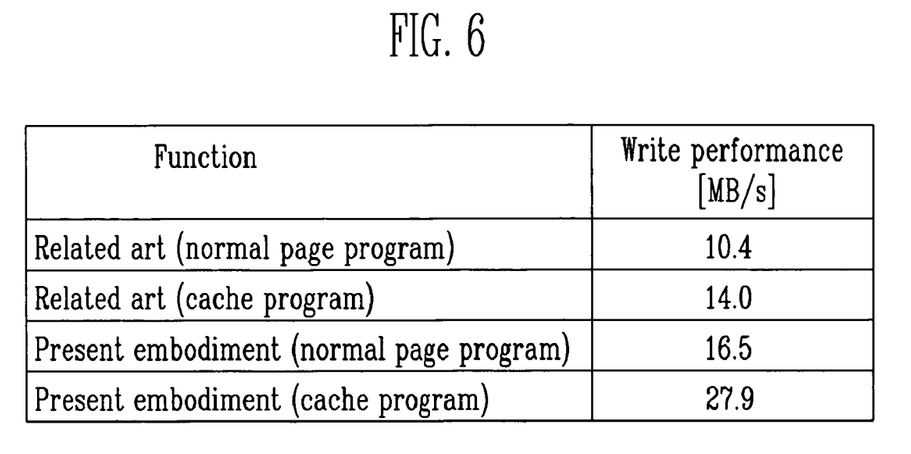
FIG. 6 is a table showing that the program performance has been improved when the program operation is performed according to one embodiment of the present invention in comparison with the related art.

FIG. 6 is a table showing that the program performance has been improved when the program operation is performed according to one embodiment of the present invention with respect to a conventional method.

Referring to FIG. 6, the normal page program performance is 10.4 Mb/s and the cache program is 14.0 Mb/s in the related art, whereas the program performance of the normal page program is 16.5 Mb/s and the cache program performance is 27.9 Mb/s according to the present embodiment. Therefore, it can be seen that the present embodiment has the program performance of 60% higher than that of the conventional art.

As described above, in accordance with the present embodiment, NAND flash memory chips stacked within a package can be operated without waiting for the previous operation to be completed. Therefore, the overall operating time of several NAND flash memory chips stacked within a package can be shortened.

Although the foregoing description has been made with reference to the specific embodiments, it is to be understood that changes and modifications of the present invention may be made by those ordinary skilled in the art without departing from the spirit and scope of the present invention.

What is claimed is:

1. A method of operating flash memory chips, the method comprising:
    (a) sequentially applying an operation command and an address to N flash memory chips stacked vertically;
    (b) checking whether or not an operation corresponding to the operation command applied to a first flash memory chip has been completed, as a result of the check, if the operation of the first flash memory chip is determined not to have been completed, checking whether or not an operation corresponding to the operation command applied to a second flash memory chip has been completed, and as a result of the check, if the operation corresponding to the operation applied to the first flash memory chip is determined to have been completed, determining whether or not the operation has been completed corresponds to a last page of the first flash memory chip;
    (c) as a result of the determination, if the operation completed by the first flash memory chip is determined to be the last page of the first flash memory chip, checking whether or not the operation corresponding to the operation command applied to the second flash memory chip has been completed, and as a result of the determination, if the operation completed by the first flash memory chip does not correspond to the last page of the first flash memory, applying another operating command and another address to the first flash memory chip, and then checking whether or not the operation has been completed by the second flash memory chip;
    (d) if the operation has not been completed after checking an $N^{th}$ flash memory chip by sequentially performing the steps (b) and (c), allowing the process to return to the step (b), and if the operation has been completed, determining whether or not the operation completed corresponds to a last page of the $N^{th}$ flash memory chip; and
    (e) as a result of the determination, if the operation completed corresponds to the last page of the $N^{th}$ flash memory chip, returning to the step (b), and if the operation completed does not correspond to the last page of the $N^{th}$ flash memory chip, applying another operating command and another address to the $N^{th}$ flash memory chip, and then returning to the step (b).

2. The method as claimed in claim 1, wherein in the step of determining whether the operation completed corresponds to the last page of the Nth flash memory chip, if the operation has been completed with respect to the last pages of all of the N flash memory chips, the operation of the all N flash memory chips is stopped.

3. The method as claimed in claim 1, wherein in the step of sequentially applying the operation command and the address to the N flash memory chips, the operating command and the address are applied to a flash memory chip that will be driven next, before the operation of a flash memory chip that has previously received the operation command is finished.

4. The method as claimed in claim 1, wherein the operating command applied to the first to $N^{th}$ flash memory chips is program operation command, an erase operating command or a read operating command.

5. The method as claimed in claim 1, wherein when the address is increased and the operating command and the increased address are then applied to the first to Nth flash memory chips, an operating command of a different kind from the operating command that has been previously applied is applied.

* * * * *